(12) United States Patent
Samuelson et al.

(10) Patent No.: US 10,128,394 B2
(45) Date of Patent: Nov. 13, 2018

(54) NANOWIRE-BASED SOLAR CELL STRUCTURE

(71) Applicant: QUNANO AB, Lund (SE)

(72) Inventors: Lars Samuelson, Malmo (SE); Martin Magnusson, Malmo (SE); Federico Capasso, Cambridge, MA (US)

(73) Assignee: QUNANO AB, Lund (SE)

( * ) Notice: Subject to any disclaimer, the term of this patent is extended or adjusted under 35 U.S.C. 154(b) by 0 days.

(21) Appl. No.: 15/374,217

(22) Filed: Dec. 9, 2016

(65) Prior Publication Data

US 2017/0155008 A1 Jun. 1, 2017

Related U.S. Application Data

(62) Division of application No. 12/452,175, filed as application No. PCT/SE2008/050734 on Jun. 19, 2008, now abandoned.

(30) Foreign Application Priority Data

Jun. 19, 2007 (SE) .................................. 0701513
Sep. 13, 2007 (SE) .................................. 0702072

(51) Int. Cl.
*H01L 31/054* (2014.01)
*H01L 31/0725* (2012.01)
(Continued)

(52) U.S. Cl.
CPC ........ *H01L 31/0547* (2014.12); *G02B 6/0096* (2013.01); *H01L 31/035227* (2013.01); *H01L 31/0725* (2013.01); *H01L 31/0735* (2013.01)

(58) Field of Classification Search
CPC ............. H01L 31/0547; H01L 31/0735; H01L 31/0725; H01L 31/035227; G02B 6/0096
(Continued)

(56) References Cited

U.S. PATENT DOCUMENTS 4,234,352 A 11/1980 Swanson
7,335,908 B2 2/2008 Samuelson et al.
(Continued)

FOREIGN PATENT DOCUMENTS

CN 1649176 A 8/2005
CN 1855552 11/2006
(Continued)

OTHER PUBLICATIONS

Indian Patent Office, First Examination Report for Indian Application No. 112/DELNP/2010, dated Jun. 30, 2017, 7 pages.
(Continued)

*Primary Examiner* — Jayne L Mershon
(74) *Attorney, Agent, or Firm* — The Marbury Law Group PLLC (57) ABSTRACT

The solar cell structure according to the present invention comprises a nanowire (205) that constitutes the light absorbing part of the solar cell structure and a passivating shell (209) that encloses at least a portion of the nanowire (205). In a first aspect of the invention, the passivating shell (209) of comprises a light guiding shell (210), which preferably has a high- and indirect bandgap to provide light guiding properties. In a second aspect of the invention, the solar cell structure comprises a plurality of nanowires which are positioned with a maximum spacing between adjacent nanowires which is shorter than the wavelength of the light which the solar cell structure is intended to absorbing order to provide an effective medium for light absorption. Thanks to the invention it is possible to provide high efficiency solar cell structures.

12 Claims, 8 Drawing Sheets

(51) Int. Cl.
  *H01L 31/0735* (2012.01)
  *H01L 31/0352* (2006.01)
  *F21V 8/00* (2006.01)
(58) Field of Classification Search
  USPC .......................................................... 136/252
  See application file for complete search history.

(56) References Cited

U.S. PATENT DOCUMENTS

| | | | |
|---|---|---|---|
| 7,402,531 | B1 | 7/2008 | Kuekes et al. |
| 8,952,354 | B2 | 2/2015 | Olson |
| 2002/0172820 | A1 | 11/2002 | Majumdar et al. |
| 2004/0075464 | A1 | 4/2004 | Samuelson et al. |
| 2004/0095658 | A1 | 5/2004 | Buretea et al. |
| 2004/0109666 | A1 | 6/2004 | Kim, II |
| 2004/0115858 | A1 | 6/2004 | Spivack et al. |
| 2004/0144416 | A1* | 7/2004 | Wang .................... B01J 21/063 136/243 |
| 2005/0009224 | A1 | 1/2005 | Yang et al. |
| 2005/0121068 | A1 | 6/2005 | Sager et al. |
| 2005/0253164 | A1* | 11/2005 | Bhat .................... H01L 29/205 257/104 |
| 2006/0207646 | A1* | 9/2006 | Terreau ............. B32B 17/10018 136/251 |
| 2006/0207647 | A1 | 9/2006 | Tsakalakos et al. |
| 2007/0137697 | A1 | 6/2007 | Kempa et al. |
| 2007/0204901 | A1* | 9/2007 | Dutta .............. H01L 31/035281 136/256 |
| 2008/0092938 | A1* | 4/2008 | Majumdar ............. B82Y 10/00 136/200 |
| 2008/0274834 | A1 | 6/2008 | Comeau et al. |
| 2008/0156366 | A1* | 7/2008 | Kim ........................ B82Y 20/00 136/255 |
| 2008/0178931 | A1* | 7/2008 | Seo .................... H01L 31/0296 136/255 |
| 2009/0266411 | A1* | 10/2009 | Habib .................. H01L 27/301 136/255 |
| 2010/0154861 | A1 | 6/2010 | Gritters |
| 2010/0186809 | A1 | 7/2010 | Samuelson et al. |
| 2010/0234957 | A1 | 9/2010 | Zdeblick et al. |
| 2011/0033969 | A1 | 2/2011 | Chaudhari |
| 2011/0269264 | A1 | 11/2011 | Korevaar et al. |

FOREIGN PATENT DOCUMENTS

| | | |
|---|---|---|
| CN | 1855552 A | 11/2006 |
| EP | 1537445 B1 | 8/2005 |
| EP | 1703569 A2 | 9/2006 |
| EP | 1892769 A2 | 2/2008 |
| EP | 1923918 A2 | 5/2008 |
| EP | 1944811 A2 | 7/2008 |
| EP | 1944812 A2 | 7/2008 |
| WO | WO02080280 A1 | 10/2002 |
| WO | WO 2004/053905 A2 | 6/2004 |
| WO | WO 2006/138671 A2 | 12/2006 |
| WO | WO2007102781 A1 | 9/2007 |
| WO | WO2008156421 A2 | 12/2008 |

OTHER PUBLICATIONS

First Chinese Office Action and SIPO Search Report for Chinese Patent Application No. 201610640931.7, dated Mar. 14, 2017, with English Language Translation, 11 pages.
U.S. Department of Energy press release, Dec. 5, 2006, "New World Record Achieved in Solar Cell Technology," 2 pages.
Dimroth, F., "High-efficiency solar cells from III-V compound semiconductors," Phys. Stat. Sol., 2006, 3(3):373-379.
Kazmerski et al., "Solar photovoltaics R&D at the tipping point: A 2005 technology overview," Journal of Electron Spectroscopy and Related Phenomenon, 2006, 150:105-135.
Szmidt et al., "DLC Passivation Layuers for High Voltage Silicon Devices," Electrochemical Conference, Melecon 98, 9th Mediterranean, vol. 1, pp. 345-348 (1998).
Ji et al., "Silicon Nanostructures by Metal Induced Growth (MIG) for Solar Cell Emitters," Photovoltaic Specialists Conference, 2002, Conference Record of the 29th IEEE, pp. 1314-1317.
Chinese Application No. 200880103566.X, SIPO Search Report dated Mar. 3, 2015.
Chinese Application No. 200880103566.X, SIPO Third Office Action dated Mar. 11, 2015.
Chinese Application No. 200880103566.X, SIPO Fourth Office Action dated Nov. 13, 2015.
Extended European Search Report Pursuant to Rule 62 EPC, Supplementary European Search Report (Art. 153(7)EPC), and European Search Opinion for European Application No. 08767200.2, dated Nov. 24, 2017, 6 pages.
European Patent Office Communication Pursuant to Article 94(3) for European Patent Application No. 10716906.2, dated Aug. 19, 2016, 4 pages.
WIPO, International Preliminary Report on Patentability, International Application No. PCT/SE2010/050396, dated Oct. 18, 2011.
WIPO, International Search Report, International Application No. PCT/SE2010/050396, dated Jul. 13, 2010.
WIPO, Written Opinion of the International Search Authority, International Application No. PCT/SE2010/050396, dated Jul. 13, 2010.
Chaudhari et al., "Heteroepitaxial Silicon Film Growth at 600° C. from an Al—Si Eutectic Melt," Thin Solid Films, vol. 518 (2010) pp. 5368-5371.
Olson, J., "Multi-Junction Photovoltaic Cell With Nanowires," U.S. Appl. No. 14/599,203, filed Jan. 16, 2015, 32 pages.

* cited by examiner (a)

Fig. 10

NANOWIRE-BASED SOLAR CELL STRUCTURE

TECHNICAL FIELD OF THE INVENTION

The present invention relates to a solar cell structure. In particular the invention relates to a solar cell structure comprising a nanowire as an active component.

BACKGROUND OF THE INVENTION

Interest in solar cell technology has been increasing over the last years. Increasing energy costs as well as environmental concerns are factors behind this interest. Also technology breakthroughs, indicating the possibilities for large scale production of high efficiency solar cells have been important factors.

Figure 1:
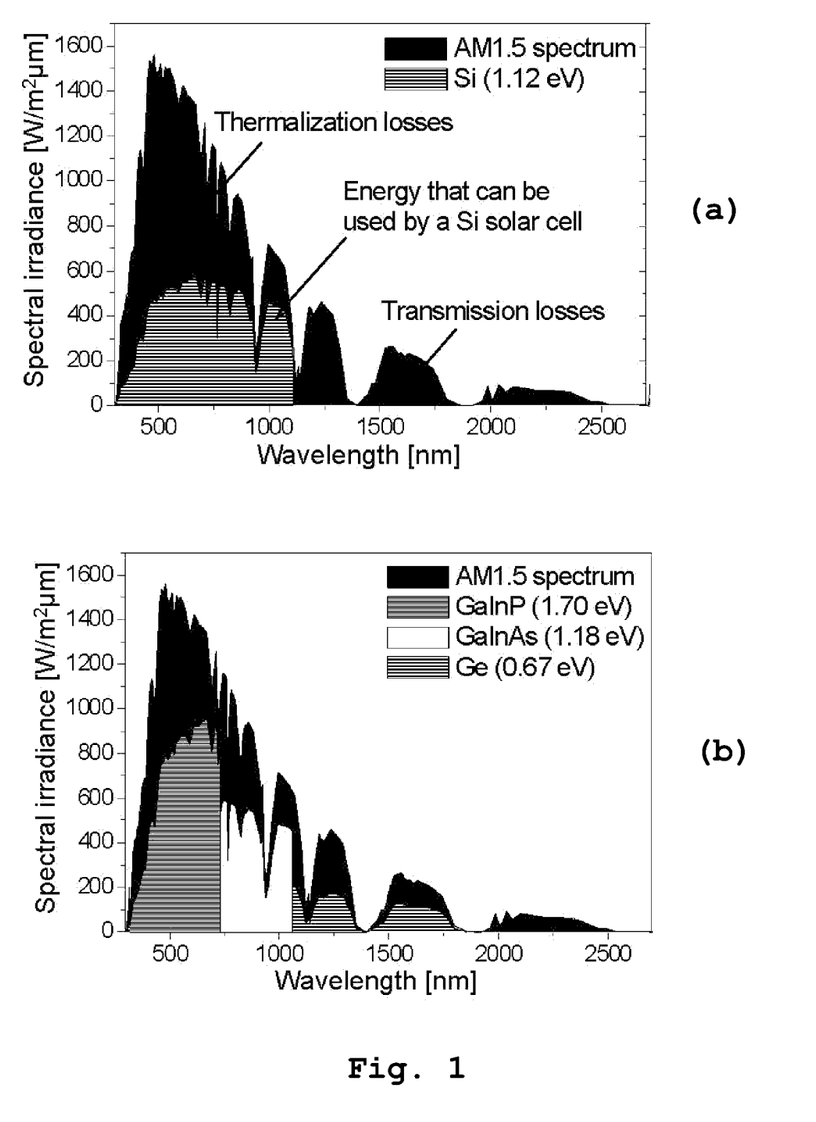
FIG. 1 schematically illustrates the part of the AM1.5 solar spectrum that can be theoretically used by a silicon-based solar cell and a GaInP/GaInAs/Ge-based solar cell, respectively, wherein dark areas indicate efficiency loss due to the thermalisation of charge carriers or the transmission of photons.

The most highly efficient existing solar cells are made of III-V semiconductors, such as GaInP or GaInAs, in multi junction cells with several layers each absorbing different parts of the solar spectrum. The advantage of this concept is illustrated by FIG. 1 showing the part of the solar AM1.5 spectrum that can be converted into electrical energy by a typical silicon photo voltaic (PV) cell compared to a GaInP/GaInAs/Ge tandem structure.

The theoretical limit for the power conversion efficiency of a solar cell based on a single semiconductor material is 31%. Multi junction photo voltaic cells (MJPV) can raise this limit to 43% for a dual junction and 49% for a triple junction solar cell. However, fabrication of all the necessary different material combinations is challenging and a high material quality of the crystals is essential for achieving high efficiencies.

Much progress has occurred and in December 2006 Boeing/Spectrolab announced (http://www.spectrolab.com/com/news/news-detail.asp?id=172) that they had demonstrated a record conversion efficiency of 40.7% using a 3-junction MJPV GaInP/GaInAs/Ge cells under 400× concentrated sunlight. This technology was, as mentioned in F. Dimroth, "High-efficiency solar cells from III-V compound semiconductors" Phys. Stat. Sol. (c) 3, 373 (2006), originally developed for space applications where Germanium (Ge) is a suitable substrate material. The availability of Ge in the Earth's crust is limited and it is expensive, and if such high efficiency tandem solar cells were used in large quantities on earth, this could be a limitation. For this reason, the development of multi junction solar cells based on crystalline Si, or even on simpler substrates, would open new opportunities for terrestrial applications, taking advantage of the higher multi junction efficiencies, lower cost and higher availability of Si substrates compared to Ge. A prior art multi junction photovoltaic cell comprising lattice matched layers grown on a Ge substrate is disclosed in L. L. Kazmerski "Solar photovoltaics R&D at the tipping point: A 2005 technology overview" J Electr Spectr Rel Phen 150, 105 (2006)). This MJPV cell reaches efficiencies of more than 40% with concentrators.

However, technical barriers for planar III-V multi junction solar cells can be identified. Efficiencies above 50% will be very difficult to reach due to physical limitations. Conventional III-V materials for multi junction solar cells require perfect lattice matching over large substrate areas to avoid dislocations. Good device functionality will also require a very high degree of compositional homogeneity over an entire wafer. This makes up-scaling to large area substrates extremely challenging, even if such substrates were available at reasonable cost. Even if these problems could be overcome, the limited number of materials that both have the right band gaps and are more or less lattice matched makes it very difficult to produce more than three junctions in planar solar cells, which is necessary for reaching very high efficiencies.

In addition to the above technical challenges, which are associated with the prior art multi junction cell, both cost and scaling present problems. By way of example multi-junction cells grown on Ge or III-V substrates are very expensive due to the high substrate costs and the small wafer sizes. Moreover, III-V materials are today epitaxially grown in high-grade MOCVD or even MBE reactors with low throughputs and the high cost of the precious raw materials makes the use of optical concentrators necessary to improve the cost-performance ratio on the system level. Even if the cost could be reduced, concentrators would still be necessary to achieve a saturated voltage even under full sunlight.

SUMMARY OF THE INVENTION

Prior art solar cell devices need to be improved in order to achieve the anticipated or "theoretical" advantages with regards to efficiency and production costs.

The object of the present invention is to overcome the drawbacks of the prior art. This is achieved by solar cell structures and the solar cell modules as defined in the independent claims.

A solar cell structure according to the present invention comprises a nanowire that constitutes the light absorbing part of the solar cell structure and a passivating shell that encloses at least a portion of the nanowire. Preferably the nanowire protrudes from a substrate.

In a first aspect of the invention, the passivating shell of the solar cell structure comprises a light guiding shell adjacent to the nanowire. Preferably the light guiding shell is of a material with a higher bandgap than the nanowire and preferably the light guiding shell also has an indirect bandgap.

In a second aspect of the invention, the solar cell structure comprises a plurality of nanowires which are positioned with a maximum spacing between adjacent nanowires which is shorter than the wavelength of the light which the solar cell structure is intended to absorb. Thereby incoming light will experience a so-called "effective medium" defined by the plurality of nanowires.

In one embodiment of the invention the nanowire comprises at least one segment that forms a bandgap adapted to absorb light in a wavelength region of the solar spectrum. The solar cell structure may also be provided with a plurality of segments wherein each segment is adapted to absorb light in different wavelength regions of the solar spectrum. The plurality of segments is preferably arranged so that the bandgap of each of the segments decreases in a direction away from the intended incoming light and along the longitudinal axis of the nanowire.

The plurality of segments can be connected in series by means of Esaki diodes or metallic segments.

Thanks to the invention it is possible to produce high efficiency solar cells at acceptable costs.

One advantage of the invention is that the solar cell structure allows heterostructures with no need for lattice matching, allowing a large degree of freedom in the choice of materials combinations. In principle there is no limit to the number of different band gaps, i.e. segments in the nanowire, giving the possibility to absorb the whole useful part of, or a selected portion of, the solar spectrum.

Due to the small growth area used for each individual wire, there is no need for extremely homogeneous growth over a whole wafer, which relaxes the requirements on the growth system. Also due to the small area, the substrate may be polycrystalline or thin-film silicon, or the like.

One advantage of the solar cell structure according to the first aspect of the invention is that the light guiding shell directs the light in an orderly fashion through regions of decreasing bandgap, allowing sequential light harvesting.

Further, the light guide structure provides intrinsic concentration of photons into the nanowire, giving a saturated voltage even under diffuse light conditions.

A still further advantage afforded by the invention is the possibility to use metallic segments to connect the segments of the nanowire. This is not possible in the prior art planar devices as metallic layers are not transparent. However, in the present invention, with the narrow light absorbing nanowire enclosed by a light guiding shell, non-transparency will have limited negative effect.

By placing the nanowires sufficiently close together on the substrate according to the second aspect of the invention the advantages of using nanowires is combined with an effective absorption of the light, as the incoming light "sees" the closely packed nanowires as a continuous effective medium.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION OF EMBODIMENTS

Figure 2A:
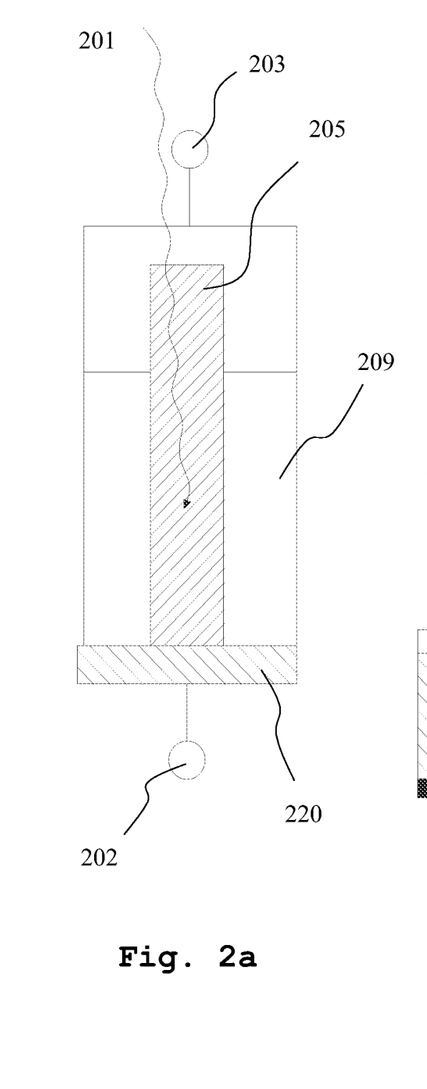
FIG. 2a schematically illustrates a solar cell structure according to one embodiment of the present invention.

FIG. 2a schematically illustrates one embodiment of a solar cell structure according to the present invention. A nanowire 205 constitutes the light absorbing part of the solar cell structure and a passivating shell 209 encloses at least a portion of the nanowire 205. Preferably the nanowire protrudes from a substrate 220. The nanowires may protrude substantially perpendicular to the substrate 220 or at an angle.

Incoming (sun)light 201 is coupled into the nanowire 205 of the solar cell structure. The incoming light generates electron-hole-pairs and preferably the light absorbing part of the solar cell structure, i.e. the nanowire 205, is configured as a pn-junction to establish an electrical field that promotes a current to flow in only one direction through the nanowire 205 between a front contact 203 and a back contact 202. By way of example the front contact 203 and the back contact 202 are respectively, as schematically illustrated in FIG. 2a, electrically connected to a top portion and a base portion of the nanowire 205, respectively, and the light 201 is coupled into the top portion of the nanowire 205.

One purpose of the passivating shell 209 in accordance with the present invention is to reduce the number of mid-gap surface states on the circumferential surface of the nanowire 205. By using a passivating shell the surface states may be moved away from the conducting nanowire. Another purpose is to insulate the nanowire 205 from the surrounding. In addition, the passivating shell can in some configurations have a more active role in the solar cell structure. The bandgap can be raised or lowered due to compressive or tensile strain or the bands can be bent in order to radially separate holes from electrons. The function of the passivating shell 209 and the above mentioned purposes are more or less important or relevant in various configurations of the solar cell structure.

In one embodiment of the present invention the passivating shell 209 comprises a light guiding shell adjacent to the circumferential surface of the nanowire 205. Preferably, the nanowire 205 is made of a direct-bandgap material and the light guiding shell 210 is made of a material with high and indirect bandgap. The light guiding shell may constitute the whole passivating shell 210 or may be in the form of an inner shell surrounded by an outer shell which outer shell has the properties described above. Since the light guiding shell is made of an indirect high-bandgap material, no light will be absorbed in this shell and the light guiding shell directs the light along the nanowire 205.

Figure 2B:
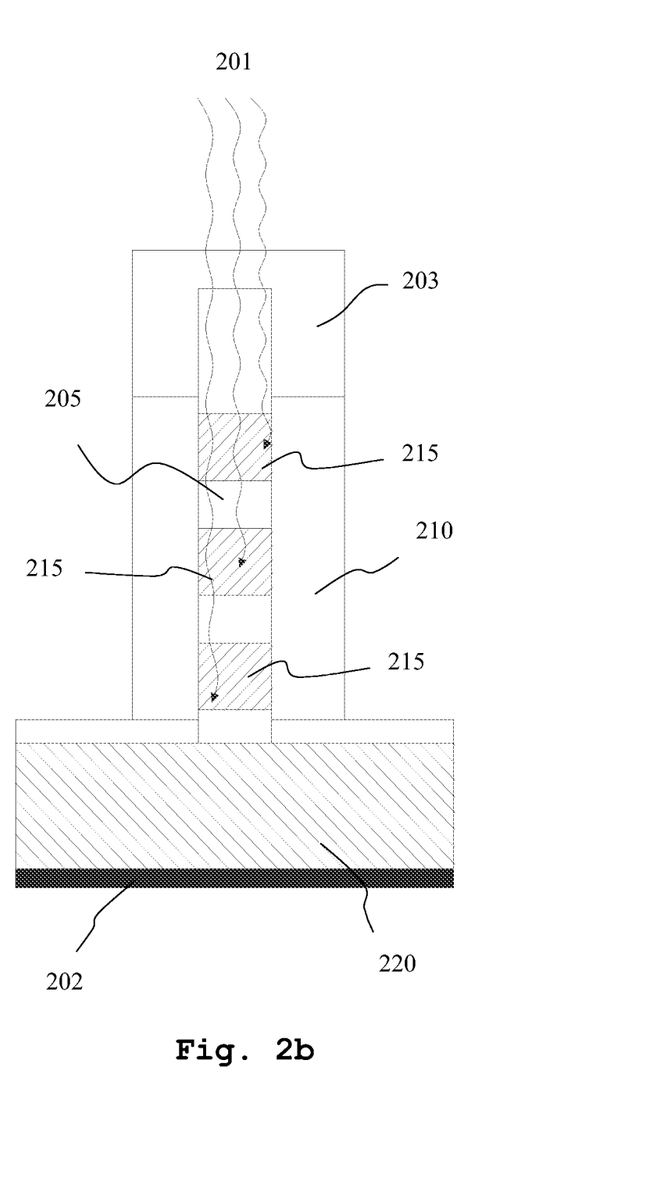
FIG. 2b schematically illustrates a solar cell structure comprising a nanowire with a plurality of segments according to one embodiment of the invention.

Referring to FIG. 2b, in a nanowire 205 comprising a semiconductor material photons with a greater energy than the band gap of the semiconductor material can be absorbed. However photons having an energy that substantially exceeds the bandgap will not only generate electron-hole-pairs but also heat, which gives thermalisation losses and hence has a negative effect on the efficiency of the solar cell. In one embodiment of the present invention the internal structure of the nanowire 205 of the solar cell according to the present invention may comprise one or more segments 215 that each forms a bandgap adapted to absorb light in a pre-determined wavelength region of the solar spectrum. A high energy component of the light will then be absorbed in a segment 215 that forms a bandgap adapted to absorb light in a pre-determined wavelength region that includes this high energy component, while photons having an energy lower than the bandgap of that segment will experience that segment as a transparent waveguide.

In one embodiment of the present invention the solar cell structure comprises a light absorbing nanowire 205 that has plurality of segments 215 distributed along the nanowire 205, wherein each of the segments 215 is adapted to absorb light in different wavelength regions of the solar spectrum. Incoming light is adapted to be coupled into a top portion of the nanowire 205. The plurality of segments 215 is arranged so that the bandgap of each of the segments 215 decreases in a direction from the top portion of the nanowire 205 towards a base portion of the nanowire 205. In this way stepwise selective absorption and transmission of light is accomplished wherein light having higher energy than the bandgap of one of the plurality of segments 215 is absorbed and the light having lower energy is transmitted to the next segment 215. The same selective absorption and transmission will then be offered by the next segment with its lower bandgap etc. Accordingly a large portion of the solar cell spectrum can be efficiently utilized with limited thermalisation losses, which gives a high efficiency.

FIG. 2b schematically illustrates one embodiment of a solar cell structure of the present invention comprising a nanowire 205 that constitutes the light absorbing part of the solar cell structure and a light guiding shell 210 that encloses at least a portion of the nanowire 205. Preferably the nanowire 205 protrudes from a substrate 220. Optionally, the nanowire 205 protrudes from a substrate 220 and comprises a plurality of segments 215 distributed along the nanowire 205, wherein each of the segments 215 is adapted to absorb light in different wavelength regions of the solar spectrum. A front contact 224 and a back contact are electrically connected to a top portion and a base portion of the nanowire, respectively. As illustrated in FIG. 2b, the front contact 224 may enclose the top portion of the nanowire 205 and the back contact 225 may be arranged on the substrate 220 on the opposite side of the nanowire 205. In order to efficiently absorb light, which is coupled into the solar cell structure at the top portion, the plurality of segments 215 is arranged so that the bandgap of each of the segments 215 decreases in a direction from the top portion of the nanowire 205 towards the base portion of the nanowire 205. The light guiding shell 210 is made of a material with higher bandgap than the light absorbing part of the nanowire 205 and preferably this bandgap is indirect. Thereby the light guiding shell 210 guides the incoming light in a direction from the top portion to the base portion of the nanowire 205 without absorption therein. Accordingly incoming light of longer and longer wavelengths is successively absorbed in each of the segments 215. Optionally the solar cell structure comprises a dielectric layer covering the substrate surface in a wrap-around configuration about the base portion of the nanowire 205. Furthermore the solar cell structure that is illustrated in FIG. 2b may comprise an outer shell layer with passivating and insulating properties, as described above, that encloses the light guiding shell 210. Together the light guiding shell and this outer shell layer then constitute a passivating shell of the solar cell structure.

Figure 3:
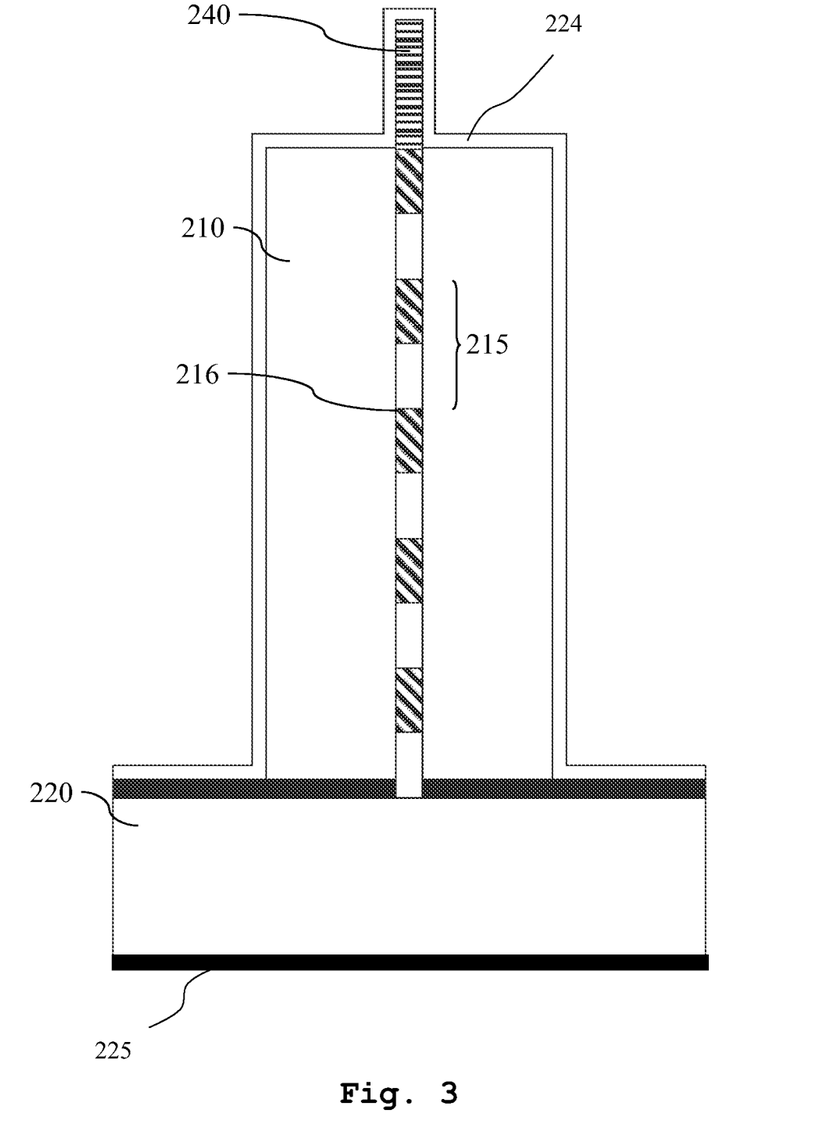
FIG. 3 schematically illustrates a solar cell structure in accordance with the present invention wherein a top portion of the nanowire protrudes out from the light guiding shell.

FIG. 3 schematically illustrates one embodiment of a solar cell structure of the present invention wherein the light-absorbing part is a nanowire 205 protruding from a substrate 220 and partly enclosed by a light guiding shell 210. A top portion 240 of the nanowire 205 extends out from the light guiding shell 209. A front contact 224 and a back contact 225 are electrically connected to the top portion 240 and a base portion of the nanowire 205, respectively. As illustrated in FIG. 3b, the back contact 225 may be arranged on the substrate 220 on the opposite side of the nanowire 205 and the front contact 224 encloses the top portion 240. The front contact 224 may be a metal grid contacting the top portion 240 of the nanowire 205 or a transparent contact covering the entire solar cell structure. In addition the top portion 240 of the nanowire 205 that extends above the light guiding shell 210 may be doped to further enhance contact properties. Preferably, the nanowire 205 comprises direct-bandgap materials and the light guiding shell 210 is made of at least one indirect-bandgap material with a higher bandgap than the direct-bandgap materials of the nanowire 205 in order to obtain a light guiding function from the light guiding shell 210. The nanowire 205 comprises a plurality of segments 215 that each forms a bandgap adapted to absorb light in a pre-determined wavelength region of the solar spectrum. Preferably, the plurality of segments 215 is arranged so that the bandgaps formed by the segments 215 successively decrease in a direction from the top portion 240 of the substrate 220 and along the nanowire 205 towards the base portion. In use the incoming light is coupled into the solar cell structure and firstly high energy photons are absorbed, then photons with successively lower energy are successively absorbed in segments 215 as they travel towards the base portion of the nanowire 205. Since the light is guided by the light guiding shell 210 the nanowire may be non-transparent in parts. The segments 215 may be connected in series by means of for example Esaki diodes 216 or short metallic segments.

The nanowire technology allows the formation of heterostructures, such as the internal structure of the nanowire 205 that is formed by the plurality of segments 215, with no need for lattice matching, which gives a large degree of freedom in material combinations. Hence band gaps for the absorption of practically any wavelength region of the solar spectrum can be accomplished in the nanowire 205 (which cannot readily be made using prior art planar technology). In principle there is no limit to the number of different band gaps of the segments 215 of the nanowire 205 according to the present invention and hence light from a large portion of the solar cell spectrum can be absorbed.

The light guiding shell 210 is preferably epitaxially connected to the nanowire 205 by radial growth of the light guiding shell onto the nanowire 205.

In one embodiment of the present invention the solar cell structure comprises a nanowire 205, which preferably is in the center of the light guiding shell 210. The light guiding shell 210 is made of an indirect high-bandgap material and is sufficiently narrow to allow only single mode light propagation, and the nanowire is small in comparison. The function of the solar cell structure according to this embodiment is as follows: Light is coupled into the solar cell structure at the top portion 240 of the nanowire 205. Since the light guiding shell 210 is an indirect high-bandgap material, no light will be absorbed here, and since the light guiding shell is single-mode, the field is strongest in the core, i.e. at the position of the nanowire 205. As light travels downward, higher energies are efficiently absorbed, while photons with energies lower than the band gap will experience only a transparent waveguide. As the energy bands are sequentially skimmed off in the nanowire 205, the photons give rise to a photo-voltage in each segment 215, the photo-voltage being equal to the band gap in that segment. Ideally, the structure will be so efficient that only low-energy light penetrates to the substrate. However, the substrate may also comprise a standard photodiode to collect stray higher-energy photons and generate a photo-voltage.

Figure 4A:
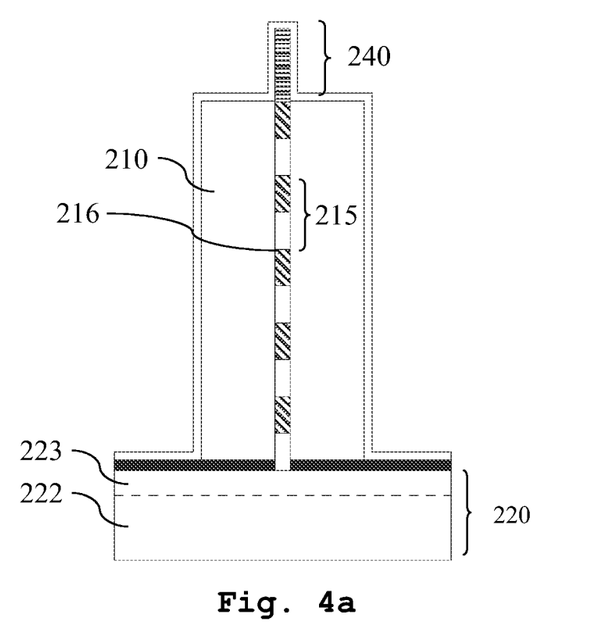
FIGS. 4a-b illustrate schematically embodiments of the invention, wherein in 4a, the substrate is provided with a diode, and in 4b, the nanowire terminates at the top end of the light guiding shell.

The substrate 220 of the solar cell structure of the present invention may either function simply as a mechanical support and electrical contact, as illustrated in FIG. 3, or it may also contain one or more electrically active components, for example a standard photodiode structure. One embodiment of such a solar cell structure with a photodiode, realized by oppositely doped regions 222,223, by way of example a p-doped region 222 and subsequent n-doped region, in the substrate 220 is schematically illustrated in FIG. 4a.

Figure 4B:
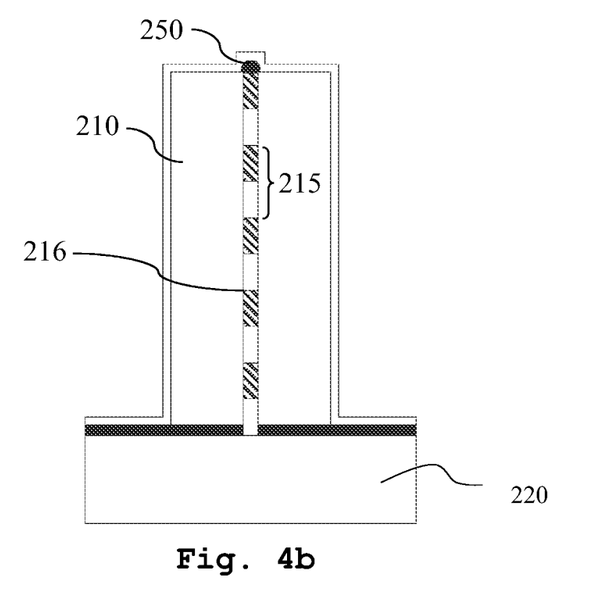

FIG. 4b illustrates another embodiment of a solar cell structure according to the present invention wherein the nanowire 205 ends at, or near to, the top of the light guiding shell 210. Possibly, but not necessarily, the nanowire 210 ends with a cap 250 of the catalytic particle which is typical for some nanowire growth methods. This arrangement is most suitable for use with flat, preferably transparent front contacts.

The light guiding shell 210 can be interpreted as being a waveguide although it is not limited to operating as a single mode waveguide. The light guiding shell 210 directs or guides the light in an orderly fashion through regions of decreasing bandgap, which enables sequential light harvesting. Moreover the light guiding 210 shell prevents losses due to absorption at the circumferential surface of the nanowire 205 and due to transmission of light out from the solar cell structure.

Figure 5A:
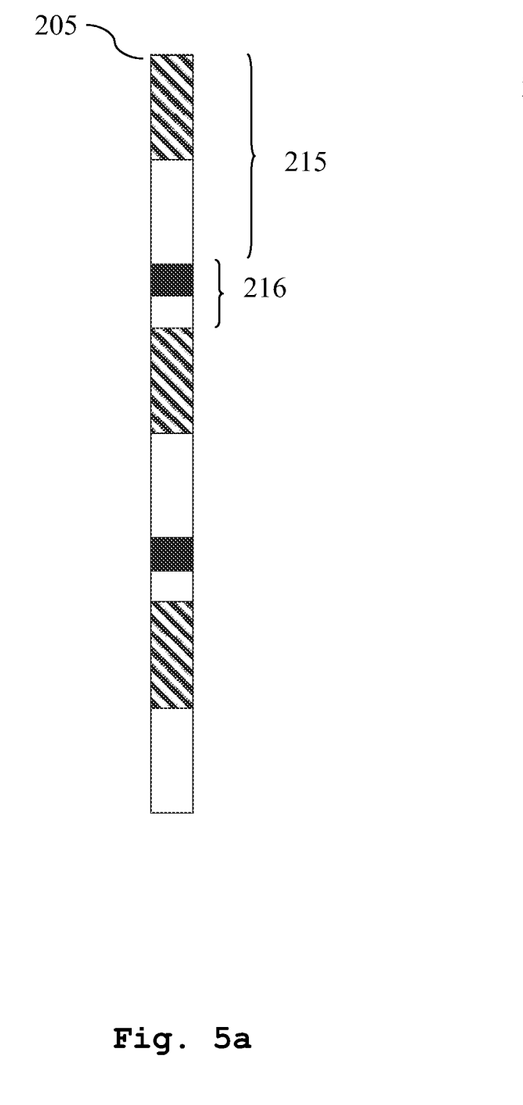
FIGS. 5a-b illustrate schematically embodiments of the invention, wherein in 5a Esaki diodes, and in 5b metallic segments, are used to interconnect the segments of the nanowire.
Figure 5B:
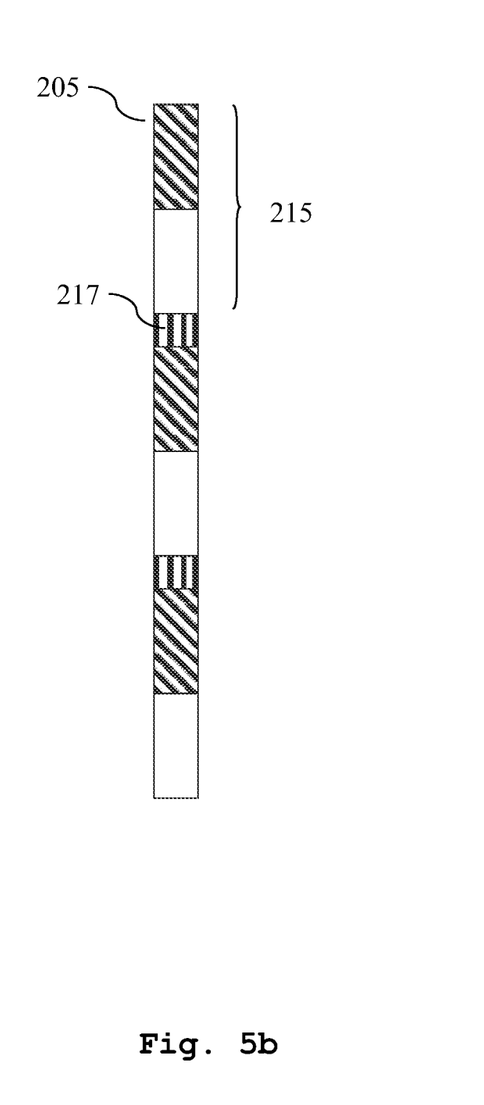

FIG. 5a illustrates schematically an enlargement of the nanowire 205, showing the segments 215 and the Esaki-diodes 216, with p- and n-type regions inside the segments. FIG. 5b illustrates schematically an embodiment of the invention wherein the Esaki-diodes, which commonly are used in prior art planar tandem cells, are exchanged for metallic segments 217. This is possible since in the solar cell structure according to the invention the need for transparency in the nanowire 205 is reduced.

A solar cell module or solar cell panel according to the present invention typically comprises a large number of the above described solar cell structures which preferably are densely packed on the substrate or wafer, so as to cover substantial part of the surface of the substrate or wafer. The solar cell module may comprise one wafer, but a plurality of wafers interconnected to give a required power production is also possible.

One advantage with the solar cell structures according to the present invention over prior art solar cells fabricated using planar technology is that these structures can be grown in much simpler systems than normal MOCVD. Furthermore, in principle materials with band gaps all through the solar spectrum can be incorporated in the nanowire. Hence the substrate can be used as a support structure only. Due to the small growth area required for each nanowire 205, there is no need for extremely homogeneous growth over a whole wafer, which relaxes requirements on growth system. Also due to the small area, the substrate may be polycrystalline or thin-film silicon, or something even simpler.

The light guiding shell arrangement provides intrinsic concentration of photons into the core, which can also give a saturated voltage even under diffuse light conditions.

Figure 6:
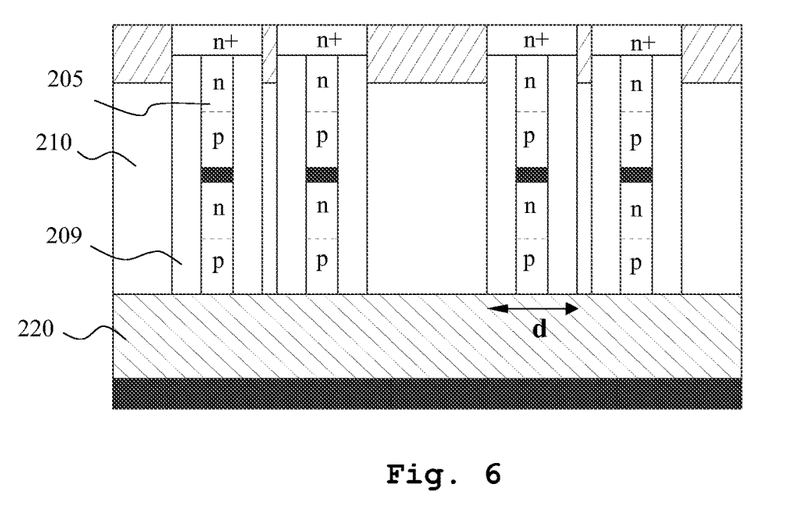
FIG. 6 illustrates schematically a solar cell structure comprising a plurality of nanowires, each multiple pn-junctions, according to one embodiment of the invention.

Referring to FIG. 6, according to one embodiment of the present invention a solar cell structure is provided that comprises nanowires 205 with a plurality of vertical pn-junctions, wherein upper pn-junctions form a high bandgap section and lower pn-junctions form a lower bandgap section. The sections are preferably separated by Esaki tunneling diodes. A light guiding shell 210 encloses the nanowires 205 and a passivating and insulating material preferably fills the volume between the nanowires. For example the tunnel diode layers can be heavily doped AlGaAs, GaAsP or GaInP.

This combination of materials with different lattice-constants would be difficult to achieve using planar technology wherein lattice matching is required. Since in the present invention lattice matching is of minor concern (as it otherwise hinders this kind of development when using traditional planar epitaxial growth methods) this approach can be extended to more junctions in the future. For a dual junction solar cell the bandgap of the top segment (sub-cell) should ideally be in the range of 1.6-1.8 eV and the bottom segment (sub-cell) in the range of 0.9-1.1 eV. These bandgap energies can be reached by using GaAsP, or GaInP for the top segment and GaInAs, or InAsP for the bottom segment. The entire energy range spanned by these material combinations for energy harvesting covers 0.4 eV (InAs) to 2.24 eV (GaInP).

In the light guide arrangement according to the present invention the width d of the light guiding shell, as indicated in FIG. 6, is larger than the wavelength $\lambda$ divided by its refractive index n. Preferably the width d is larger than 500 nm. The light guiding shell 209 directs the light along the nanowire through reflections. As illustrated in the figure the passivating shell 209 may be a matrix that fills the volume between the nanowires.

One example of a specific embodiment of a solar cell structure in accordance with the present invention has a photonic light guiding design, created via the radial growth of a fully transparent high refractive index shell, like AlN, that functions as a total light guiding structure of about 0.5 $\mu$m diameter of which about 100 nm is a multiple-bandgap core structure. The top portion (about 0.5 $\mu$m) of the nanowire 205 will, due to the dense arrangement of the elongated nanowires, capture the incoming flux of light, which is then transmitted downwards in a fashion such that the high-energy component will be captured in the top-segment which looks just like the fully transparent waveguide for all photon energies below its bandgap. The same selective absorption and transmission will then be offered by the next segment with its lower bandgap etc. Above the top selected band-gap segment is a long, heavily n-doped GaN segment used for contacting. The bottom segment may be made from InN and intermediate segments comprise increasing fractions of Ga up to the top segment with a composition of about $Ga_{0.7}In_{0.3}N$. The substrate will in this case provide support and a back contact, since the lowest bandgap will be at the bottom of the nanowire. A possible other material combination is AlGaInAsP. In this materials system, there are direct bandgap materials with values between 0.4 eV up to 2.25 eV, hence competing very well with the state-of-the-art for multi junction cells. In this case the lower segments may be formed in the well established $InAs_{1-x}P_x$ system, and the upper segments e.g. in the $Ga_xIn_{1-x}P$ system, with the top segment of Ga-rich (70%) GaInP having a direct bandgap of 2.25 eV. These are material combinations that have not been accessible using conventional planar technology methods where lattice matching is required.

Controlled absorption of (sun)light using a nanowire-based solar cell structure according to the invention can also be obtained with another approach, which can be referred to as an "effective medium"-like concept. An "effective medium" is usually described as structures containing different materials on length-scales considerably less than the wavelengths of the incident light. This concept can be seen as a replacement of the commonly used absorption in continuous films by the optical effects of absorption by a dense arrangement of preferably parallel nanowires, spaced by distances substantially smaller than the wavelength of the incident light (that is intended to be absorbed).

One embodiment of a solar cell structure according to the present invention comprises a plurality of nanowires that constitute the light absorbing part of the solar cell structure. The nanowires optionally protrude from a substrate and are provided with a maximum spacing between adjacent nanowires which is shorter than the wavelength of the light which the solar cell structure is intended to absorb in order to obtain the "effective medium" effect. Preferably a passivating shell of a material with a high and indirect bandgap encloses at least a portion of the nanowires. The passivating shell may completely fill the spacing between the nanowires.

The internal structure of the nanowires may comprise one or more segments that each forms a bandgap adapted to absorb light in a pre-determined wavelength region of the solar spectrum. By providing segments having different bandgaps, each segment is adapted to absorb light in a different wavelength region of the solar spectrum.

In one embodiment of the present invention the solar cell structure comprises a plurality of nanowires that are provided on the substrate with a maximum spacing between adjacent nanowires which is shorter than the shortest wavelength of said different wavelength regions.

Figure 7:
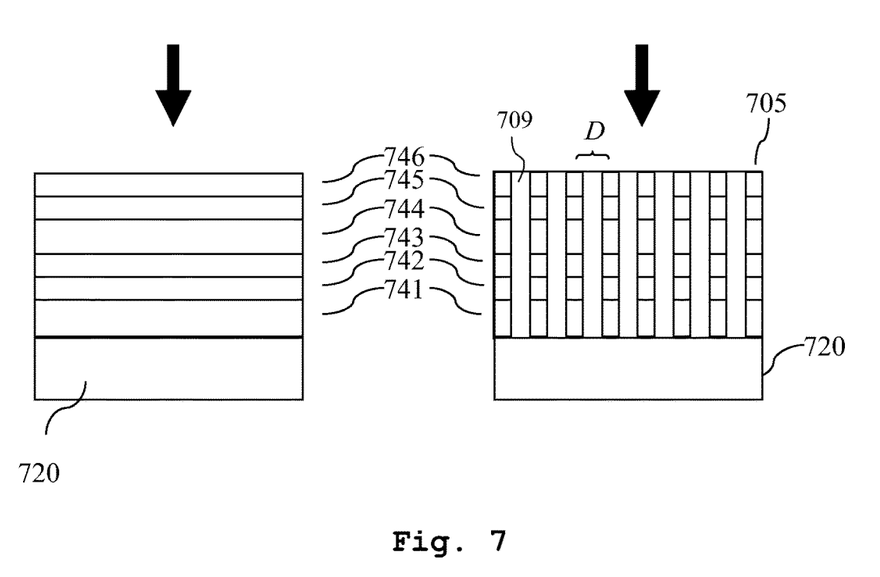
FIG. 7 illustrates schematically a solar cell structure with closely spaced nanowires which is adapted to absorb light in an effective medium approach according to the invention.

FIG. 7 schematically illustrates the "effective medium" concept, wherein a) schematically illustrates a conventional multi junction photovoltaic device fabricated using planar technology wherein a plurality of layers 741, 742, 743, 744, 745, 746 form segments which absorb different parts of the incoming light, indicated with the thick arrow. As described in the background forming such multilayer structures with appropriate material combinations is exceedingly hard and requires the use of expansive III-V substrates 720. FIG. 7b illustrates schematically the solar cell structure according to one embodiment of the present invention, comprising a matrix of densely packed nanowires 705, with a maximum nanowire spacing D, i.e. the centre-to-centre distance, which is smaller than the shortest wavelength that the device is designed to absorb. Incoming photons will "see" the dense array as a sequence of quasi-continuous absorbing layers while the generated electrons and holes will be strictly collected by the vertical nanowire structures. This approach allows standard geometries for PV-cell illumination, ensuring the sequential absorption characteristics required for the highest PV efficiencies.

The maximum spacing D between adjacent nanowires is below 400 nm, preferably below 200 nm and even more preferably below 150 nm. The width of the nanowires in this embodiment is typically in the order of 100 nm. The maximum spacing D can also be related to the wavelength $\lambda$ of the light and the effective refractive index $n_{eff}$ of the nanowire material. Preferably the maximum spacing D is less than $\lambda/n_{eff}$. The substrate 720 is preferably a silicon substrate, and the nanowires 705 are preferably grown from the substrate.

Figure 8:
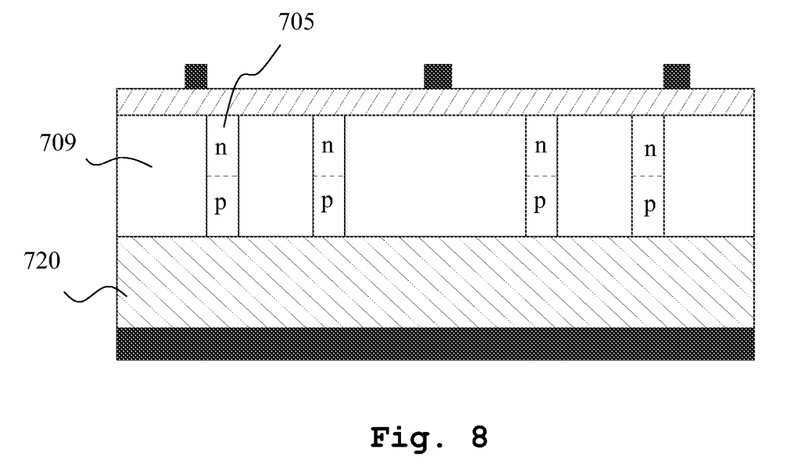
FIG. 8 illustrates schematically a solar cell structure comprising single pn-junctions according to one embodiment of the invention.

Referring to FIG. 8, according to one embodiment of the invention a solar cell structure is provided comprising nanowires 705 with a vertical single pn-junction. The substrate 720 may be p-type III-V wafers such as InP or GaAs substrates as illustrated schematically in the figure, but silicon substrates are in many cases a preferred choice. For contacting the upper-top n-conducting regions, a conducting transparent film may be deposited over the entire structure since the regions in between the n-doped nanowire regions are covered by an insulating and surface passivating dielectric mask, e.g., $SiO_2$, which constitutes the passivating shell 709 that encloses the nanowires 705.

Figure 9:
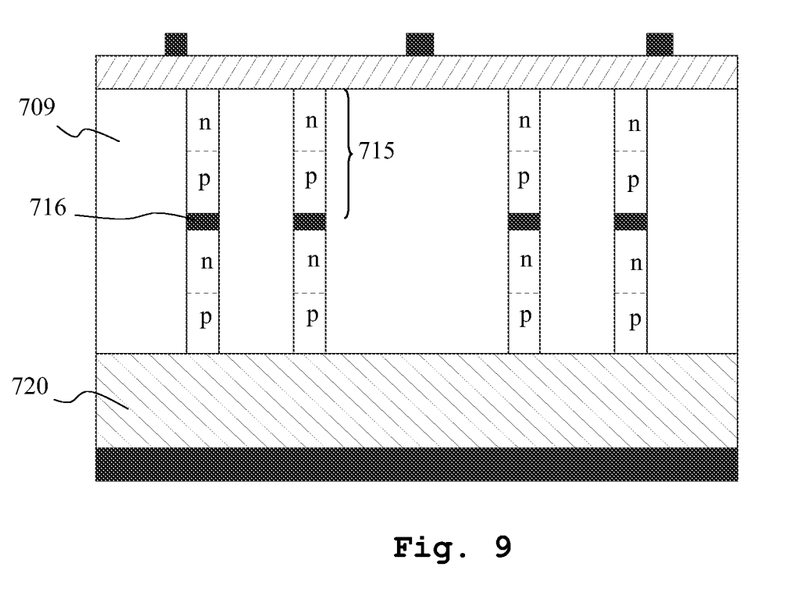
FIG. 9 illustrates schematically a solar cell structure comprising multiple pn-junctions according to another embodiment of the invention.

Referring to FIG. 9, according to one embodiment of the present invention a plurality of pn-junctions forming segments 715 are provided in an effective medium architecture. The figure schematically illustrates a tandem photovoltaic cell with embedded Esaki tunneling diodes 716 and a surrounding passivating shell 709. By choosing the nanowires 705 length, width (diameter) and density to be sufficiently high this geometry will ensure that substantially all incoming radiation will be absorbed by the nanowires 705. On top of the dual junction, a segment of indirect-bandgap material can be grown in order to enhance the light absorption efficiency for the light guide approach. The nanowire absorption of photons having energies exceeding the band gap of the material selected may be high and a wavelength dependent penetration depth can be expected.

Figure 10:
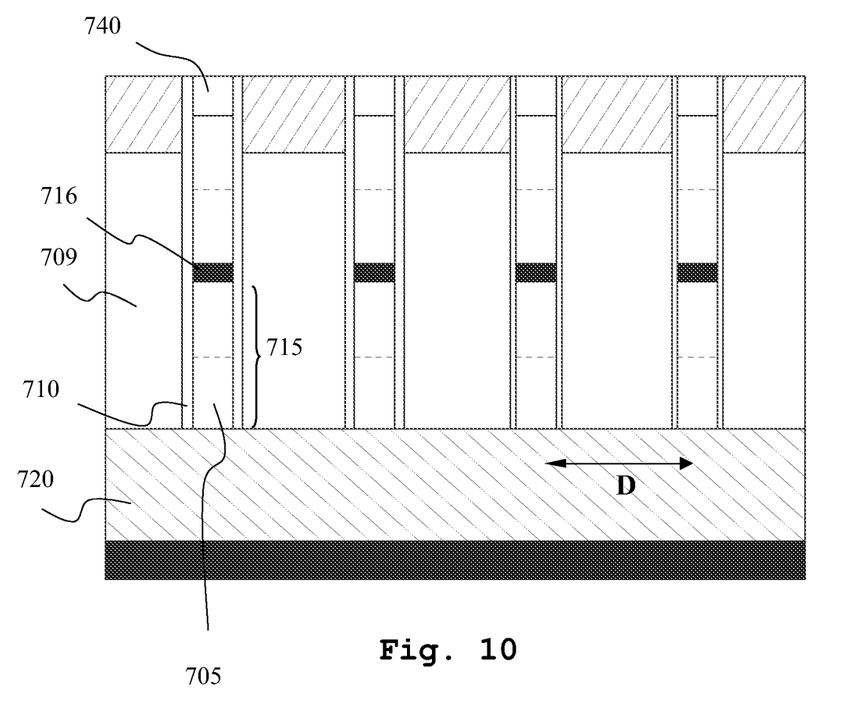
FIG. 10 illustrates schematically a solar cell structure comprising a plurality of nanowires placed closely together, wherein each nanowire is enclosed in a high and indirect bandgap material.

The passivating shell 709 in the embodiments based on the effective medium concept is mainly for passivation and insulation. However, this passivating shell 709 may comprise a light guiding shell as described in the other embodiments of this description. FIG. 10 schematically illustrates one embodiment of a solar cell structure according to the present invention comprising a plurality of nanowires 705 protruding from a substrate 720. The nanowire 705 comprises a plurality of pn-junction forming segments 715 separated by Esaki tunneling diodes 716. The nanowires 705 are closely packed, i.e. with a maximum spacing D between nanowires that is shorter than the wavelength of the light which the solar cell structure is intended to absorb. Preferably the top portion 740 of the nanowire comprises a highly doped segment to obtain a low contact resistance for the front contact. As mentioned above the passivating shell 709, which completely fills the volume between the nanowires, comprises a light guiding shell 709.

For the realization of high-efficiency multi junction photovoltaic cells based on nanowires, it is proffered that the light absorption occurs in the proper sequence, hence a random absorption in the different materials sections should be avoided. In the embodiments described above this sequential absorption is achieved using core-shell structures by which light is guided from the top to the bottom end of the nanowires.

Although the solar cell structures of the invention have been described as being adapted for coupling of light into the nanowire through the front contact or a top portion, the invention it is not limited to this. The incident light may also be transmitted into the nanowires through the substrate. In such cases the segments should be arranged with the highest energy absorbing segment nearest the substrate. Furthermore, the substrate may be thinned down or even removed.

The embodiments that comprise a plurality of segments 215,715 are not limited to segments 215,715 where each is adapted to absorb light in different wavelength regions of the solar spectrum. A nanowire 205,705 of the solar cell structure may comprise two or more segments 215,715 which are adapted to absorb light in the same pre-determined wavelength region of the solar spectrum. This can be used to step up the voltage output of the solar cell structure.

While the present invention is described in the context of multi junction PV-applications it is expected to find use in other areas of opto-electronics, such as for photodetectors. As appreciated by the skilled in the art the here described embodiments of the invention can be combined in various ways.

Suitable materials for the substrate include, but are not limited to: Si, GaAs, GaP, GaP:Zn, InAs, InP, GaN, $Al_2O_3$, SiC, Ge, GaSb, ZnO, InSb, SOI (silicon-on-insulator), CdS, ZnSe, CdTe. Suitable materials for the nanowires and nanowire segments include, but are not limited to: GaAs, InAs, Ge, ZnO, InN, GaInN, GaN AlGaInN, BN, InP, InAsP, GaP, GaAsP, GaInP, GaInAs, AlInP, GaAlInP, GaAlInAsP, GaInSb, InSb, Si. Possible donor dopants are Si, Sn, Te, Se, S, etc, and acceptor dopants are Zn, Fe, Mg, Be, Cd, etc. Suitable materials for the passivating and light guiding shell include, but are not limited to: AlN, GaN, InN, AlGaInN, BN, SiC, GaP, GaAsP, AlAs, AlP, AlSb, AlAsP, GaAlAs, GaAlAsP, AlInP, $SiO_2$, $Al_2O_3$, ZnO, SiN, $HfO_2$, $ZrO_2$, ZnCdTeSeS, glass, organic polymers, etc. It should be noted that the use of the herein described nanowire technology makes it possible to use nitrides such as GaN, InN and AlN.

While the invention has been described in connection with what is presently considered to be the most practical and preferred embodiments, it is to be understood that the invention is not to be limited to the disclosed embodiments, on the contrary, it is intended to cover various modifications and equivalent arrangements within the scope of the appended claims.

The invention claimed is:

1. A method of making a solar cell structure comprising a plurality of nanowires, the method comprising:
    determining a maximum spacing between adjacent nanowires which is shorter than a wavelength of light the solar cell structure is intended to absorb, wherein the nanowires constitute a light absorbing part of the solar cell structure;
    providing a substrate containing a photodiode;
    providing the plurality of nanowires positioned at or below the maximum spacing on the photodiode in the substrate; and
    providing a light guiding shell enclosing at least a portion of the nanowires, the light guiding shell adapted to direct incoming light along the nanowires and through the light absorbing part of the solar cell structure.

2. The method of claim 1, wherein the light guiding shell is made of a material with a higher bandgap than the nanowires, and wherein the photodiode is configured to collect photons and generate a photo-voltage.

3. The method of claim 1, wherein the maximum spacing between adjacent nanowires is shorter than 400 nm.

4. The method of claim 3, wherein the maximum spacing between adjacent nanowires is shorter than 200 nm.

5. The method of claim 4, wherein the maximum spacing between adjacent nanowires is shorter than 150 nm.

6. The method of claim 1, wherein the nanowires comprise a plurality of light absorbing segments adapted to absorb light in different wavelength regions of the solar spectrum.

7. The method of claim 6, wherein a bandgap of each of the segments in the nanowires has a smaller bandgap from a top portion towards a base portion of the nanowires.

8. The method of claim 6, further comprising providing Esaki diodes between the light absorbing segments of the nanowires.

9. The method of claim 6, further comprising providing metallic segments between the light absorbing segments of the nanowires.

10. The method of claim 6, wherein a first segment comprises a material with a bandgap in the range of 1.6-1.8 eV and a second segment comprises a material with a bandgap in the range of 0.9-1.1 eV.

11. The method of claim 1, further comprising:
    determining a spacing between adjacent nanowires at which the plurality of nanowires form a continuous effective medium for the light the solar cell structure is intended to absorb; and
    providing on the substrate the plurality of nanowires positioned at the determined spacing at which the plurality of nanowires form the continuous effective medium for the light the solar cell structure is intended to absorb.

12. The method of claim 1, further comprising:
    determining a spacing between adjacent nanowires at which the plurality of nanowires present a sequence of quasi-continuous absorbing layers to incoming photons; and
    providing on the substrate the plurality of nanowires positioned at the determined spacing at which the plurality of nanowires present the sequence of quasi-continuous absorbing layers to the incoming photons.

* * * * *